(12) United States Patent
Liu

(10) Patent No.: US 11,397,056 B2
(45) Date of Patent: Jul. 26, 2022

(54) VAPOR CHAMBER STRUCTURE

(71) Applicant: ASIA VITAL COMPONENTS (CHINA) CO., LTD., Shenzhen (CN)

(72) Inventor: Han-Min Liu, Shenzhen (CN)

(73) Assignee: ASIA VITAL COMPONENTS (CHINA) CO., LTD., Shenzhen (CN)

( * ) Notice: Subject to any disclaimer, the term of this patent is extended or adjusted under 35 U.S.C. 154(b) by 131 days.

(21) Appl. No.: 16/403,600

(22) Filed: May 5, 2019

(65) Prior Publication Data

US 2020/0292243 A1    Sep. 17, 2020

(30) Foreign Application Priority Data

Mar. 14, 2019  (TW) .................. 108108649

(51) Int. Cl.
| | |
|---|---|
| F28D 15/00 | (2006.01) |
| F28D 15/04 | (2006.01) |
| F28D 15/02 | (2006.01) |
| F28D 21/00 | (2006.01) |
| H01L 23/427 | (2006.01) |
| H01L 23/46 | (2006.01) |
| H01L 23/473 | (2006.01) |

(52) U.S. Cl.
CPC .......... *F28D 15/043* (2013.01); *F28D 15/02* (2013.01); *F28D 15/04* (2013.01); *F28D 2021/0028* (2013.01); *F28D 2021/0029* (2013.01); *H01L 23/427* (2013.01); *H01L 23/46* (2013.01); *H01L 23/473* (2013.01)

(58) Field of Classification Search
CPC ........ F28D 15/043; F28D 15/04; F28D 15/02; F28D 2021/0028; F28D 2021/0029; H01L 23/46; H01L 23/473; H01L 23/427

USPC ..................................... 165/104.26
See application file for complete search history.

(56) References Cited

U.S. PATENT DOCUMENTS

| | | | |
|---|---|---|---|
| 10,502,496 B2 * | 12/2019 | Yang | ............... H01L 23/427 |
| 2015/0060020 A1 * | 3/2015 | Yang | ............... F28D 15/0275 |
| | | | 165/104.26 |
| 2017/0347489 A1 * | 11/2017 | Lan | ............... F28D 15/0233 |
| 2019/0021188 A1 * | 1/2019 | Phan | ............... H05K 7/20336 |

FOREIGN PATENT DOCUMENTS

| | | |
|---|---|---|
| CN | 1928484 A | 3/2007 |
| JP | 200031680 A | 1/2000 |
| TW | M580851 U | 7/2019 |

OTHER PUBLICATIONS

Search Report dated Jul. 18, 2019 issued by Taiwan Intellectual Property Office for counterpart application No. 108108649.

* cited by examiner

*Primary Examiner* — Henry T Crenshaw
*Assistant Examiner* — Kamran Tavakoldavani
(74) *Attorney, Agent, or Firm* — Demian K. Jackson; Jackson IPG PLLC

(57) ABSTRACT

A vapor chamber structure includes a main body having multiple internal independent chambers. A capillary structure is disposed in each of the independent chambers. A working fluid is contained in each of the independent chambers. The working fluids contained in the independent chambers have different physical or chemical properties. The independent chambers are respectively in contact with different heat sources with different properties to conduct the heat. Accordingly, one single vapor chamber structure can provide complex heat conduction effect for different heat sources.

15 Claims, 5 Drawing Sheets

VAPOR CHAMBER STRUCTURE

This application claims the priority benefit of Taiwan patent application number 108108649 filed on Mar. 14, 2019.

BACKGROUND OF THE INVENTION

1. Field of the Invention

The present invention relates generally to a vapor chamber structure, and more particularly to a vapor chamber structure, which is applicable to multiple heat sources with different properties at the same time.

2. Description of the Related Art

It is known that heat pipes and vapor chambers are currently most often seen heat conduction components, which are used to dissipate heat instead of common pure metal. The heat pipe and vapor chamber can transfer heat at higher efficiency than pure metal. Working fluid is contained in the heat pipe and vapor chamber. By means of the change of the two-phase flow of the working fluid, the heat pipe and vapor chamber can quickly conduct heat.

At the current stage, most of the heat pipe and vapor chamber only serve to conduct heat of one single heat source. When positioned in an extremely cold or an extremely hot place, one single heat pipe or vapor chamber cannot provide heat conduction effect under two different environments. In an even worse condition, the working fluid may freeze or evaporate due to dry burning. Under such circumstance, the two-phase flow of the working fluid of the entire heat pipe or vapor chamber will stop working.

It is therefore tried by the applicant to provide a vapor chamber structure, which is applicable to multiple heat sources with different properties at the same time.

SUMMARY OF THE INVENTION

It is therefore a primary object of the present invention to provide a vapor chamber structure, which is applicable to two heat sources with different properties or two different environments at the same time.

To achieve the above and other objects, the vapor chamber structure includes a main body having multiple internal independent chambers. A capillary structure is disposed in each of the independent chambers. A working fluid is contained in each of the independent chambers. The working fluids contained in the independent chambers have different physical or chemical properties. The independent chambers are respectively in contact with different heat sources with different properties to conduct the heat. Accordingly, one single vapor chamber structure can provide complex heat conduction effect for different heat sources.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
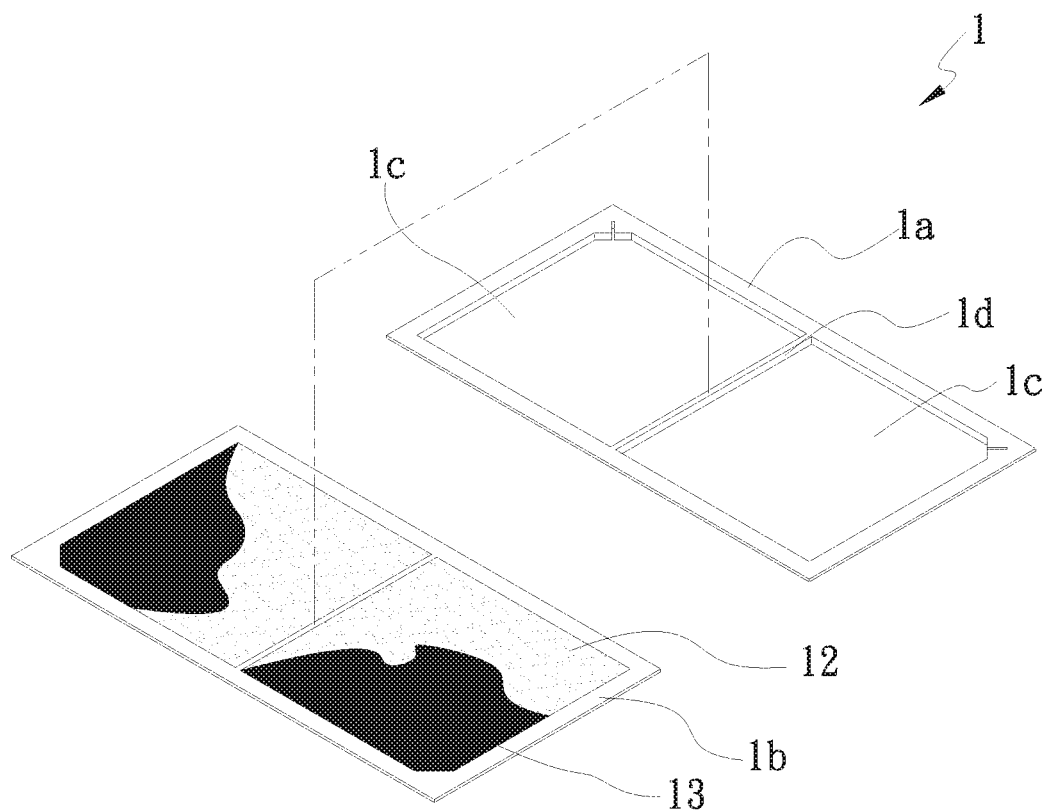
FIG. 1a is a perspective exploded view of a first embodiment of the vapor chamber structure of the present invention.
Figure 1B:
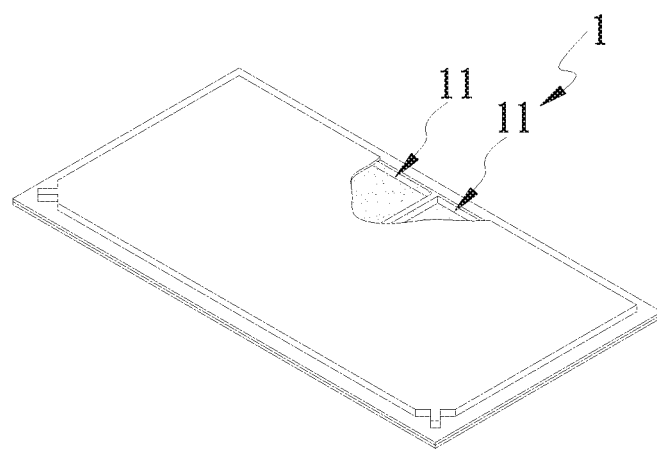
FIG. 1b is a perspective assembled view of the first embodiment of the vapor chamber structure of the present invention.

Please refer to FIGS. 1a and 1b. FIG. 1a is a perspective exploded view of a first embodiment of the vapor chamber structure of the present invention. FIG. 1b is a perspective assembled view of the first embodiment of the vapor chamber structure of the present invention. As shown in the drawings, the vapor chamber structure of the present invention includes a main body 1.

The main body 1 has multiple internal independent chambers 11. A capillary structure 12 is disposed in each of the independent chambers 11. A working fluid 13 is contained in each of the independent chambers 11.

The working fluids 13 contained in the independent chambers 11 have different physical or chemical properties. In order to facilitate the manufacturing process, the main body 1 can be made in a vacuumed state.

The main body 1 has an upper plate 1a, a lower plate 1b, a receiving space 1c and at least one partitioning body 1d. The receiving space 1c and the partitioning body 1d are selectively disposed on any of the upper and lower plates 1a, 1b. The upper and lower plates 1a, 1b are correspondingly mated with each other to together define the independent chambers 11. The upper and lower plates 1a, 1b of the main body 1 are made of a material selected from a group consisting of gold, silver, copper, aluminum, stainless steel, aluminum alloy, commercial pure titanium and titanium alloy. The upper and lower plates 1a, 1b can be made of the same material or different materials.

The capillary structure 12 is formed on the surface of the lower plate 1b. The capillary structure 12 is selected from a group consisting of sintered powder body, channeled body and fiber body. The capillary structures 12 disposed in the independent chambers 11 can be different kinds of capillary structures or the same kind of capillary structures or have the same porosity or different porosities. Alternatively, multiple kinds of capillary structures can be combined and used. The working fluid 13 is selected from a group consisting of pure water, methanol, acetone and sodium.

The physical property of the working fluid 13 is any of color, phase, odor, density, melting point and boiling point. The chemical property of the working fluid 13 is any of acidity, alkalinity, flammability, oxidizability, reducibility, toxicity, drug-likeness, stability, heat of combustion and corrosivity.

In this embodiment, the partitioning body 1d is transversely disposed on the upper plate 1a, whereby the independent chambers 11 are transversely continuously arranged along the main body 1.

Figure 2A:
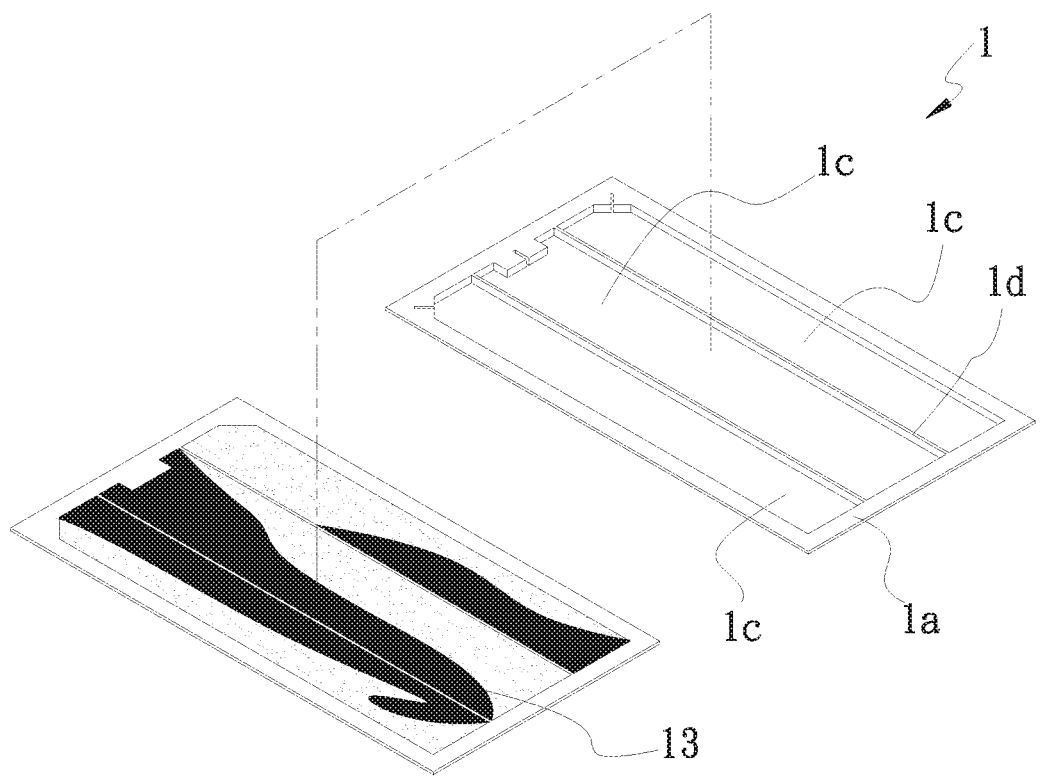
FIG. 2a is a perspective exploded view of a second embodiment of the vapor chamber structure of the present invention.
Figure 2B:
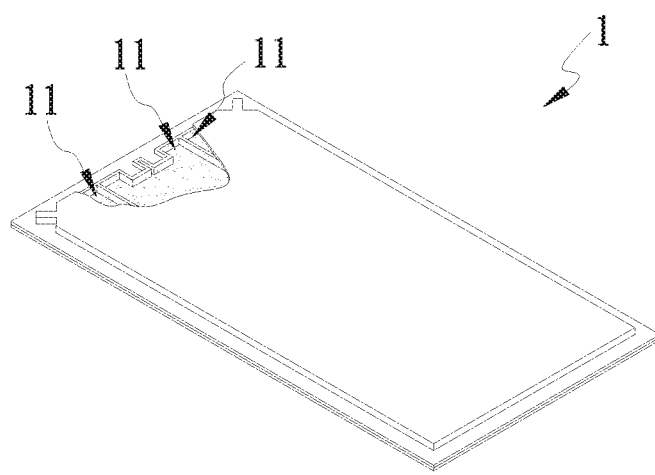
FIG. 2b is a perspective assembled view of the second embodiment of the vapor chamber structure of the present invention.

Please now refer to FIGS. 2a and 2b. FIG. 2a is a perspective exploded view of a second embodiment of the vapor chamber structure of the present invention. FIG. 2b is a perspective assembled view of the second embodiment of the vapor chamber structure of the present invention. The second embodiment is partially identical to the first embodiment in structure and thus will not be redundantly described hereinafter. The second embodiment is different from the first embodiment in that the partitioning bodies 1d are longitudinally disposed on the upper plate 1a, whereby the independent chambers 11 are longitudinally continuously arranged along the main body 1.

Figure 3A:
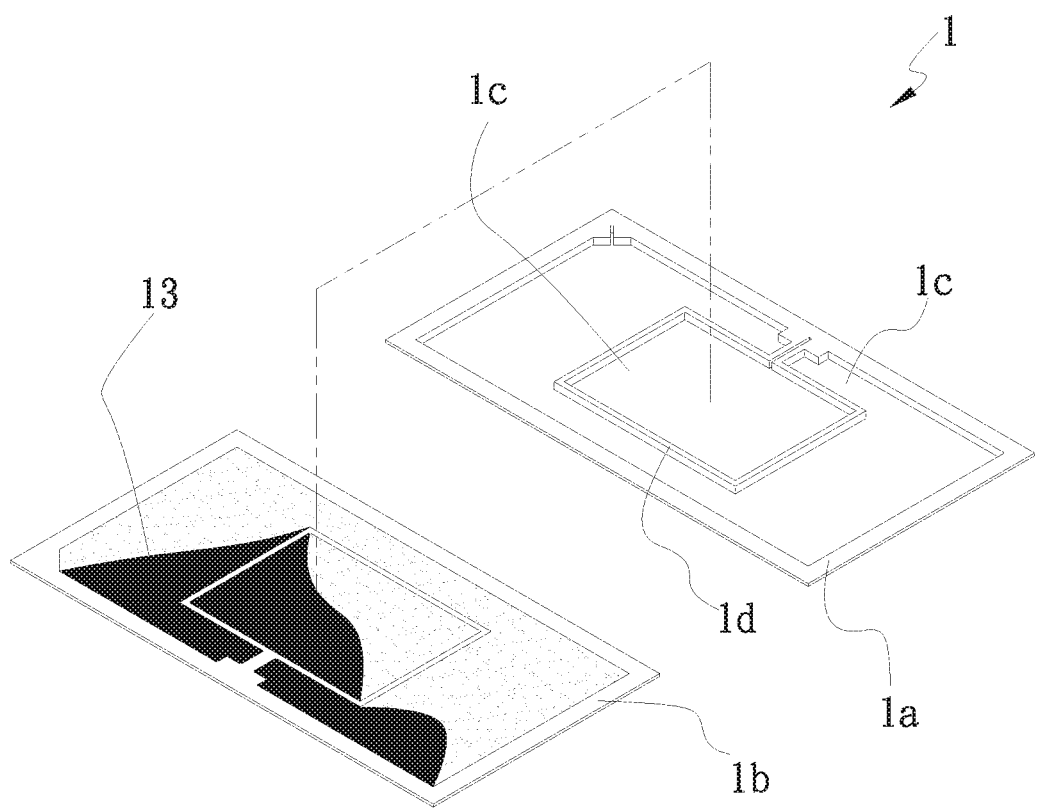
FIG. 3a is a perspective exploded view of a third embodiment of the vapor chamber structure of the present invention.
Figure 3B:
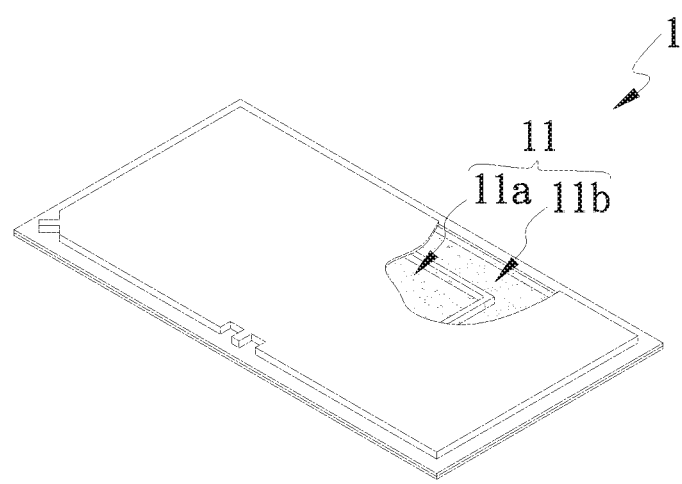
FIG. 3b is a perspective assembled view of the third embodiment of the vapor chamber structure of the present invention.
Figure 4A:
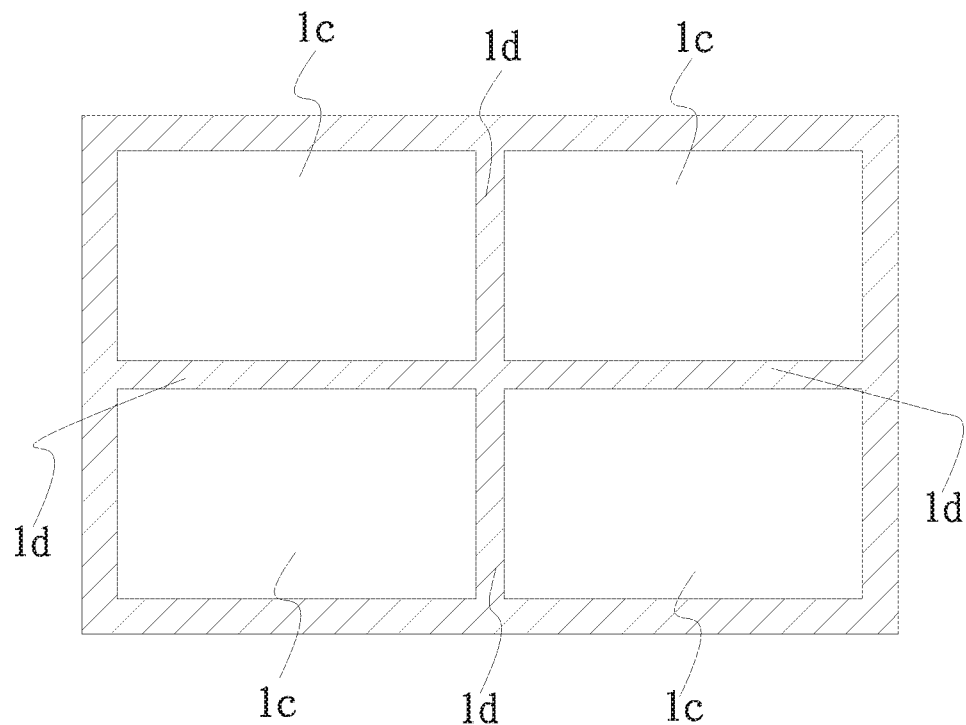
FIG. 4a is a sectional view of a fourth embodiment of the vapor chamber structure of the present invention.
Figure 4B:
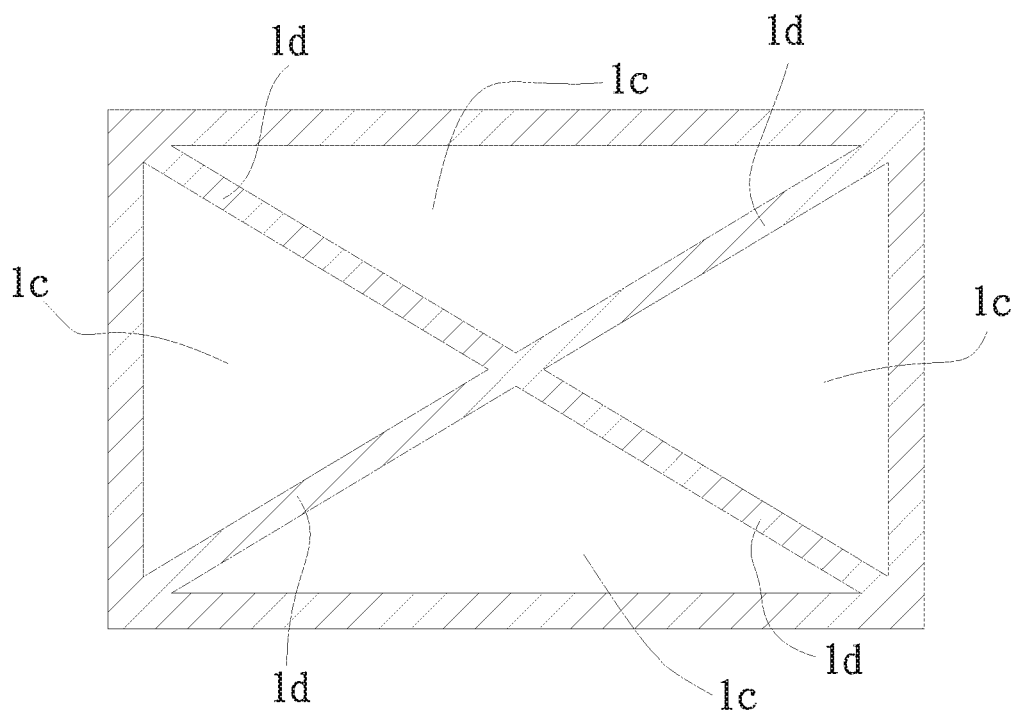
FIG. 4b is a sectional view of the fourth embodiment of the vapor chamber structure of the present invention.
Figure 4C:
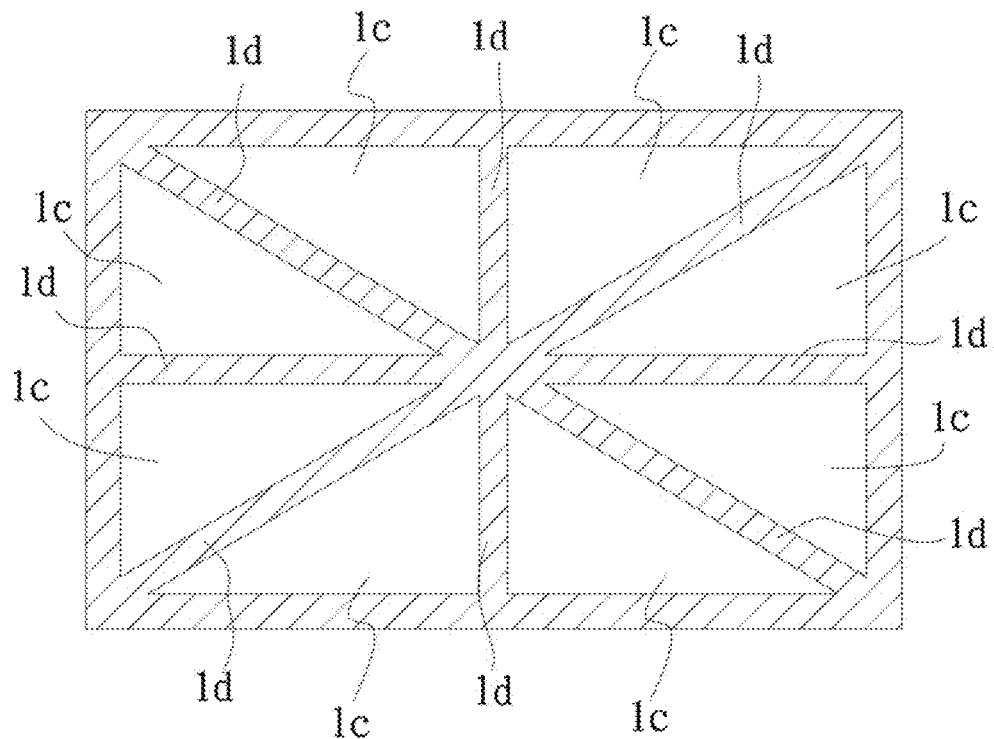
FIG. 4c is a sectional view of the fourth embodiment of the vapor chamber structure of the present invention.
Figure 4D:
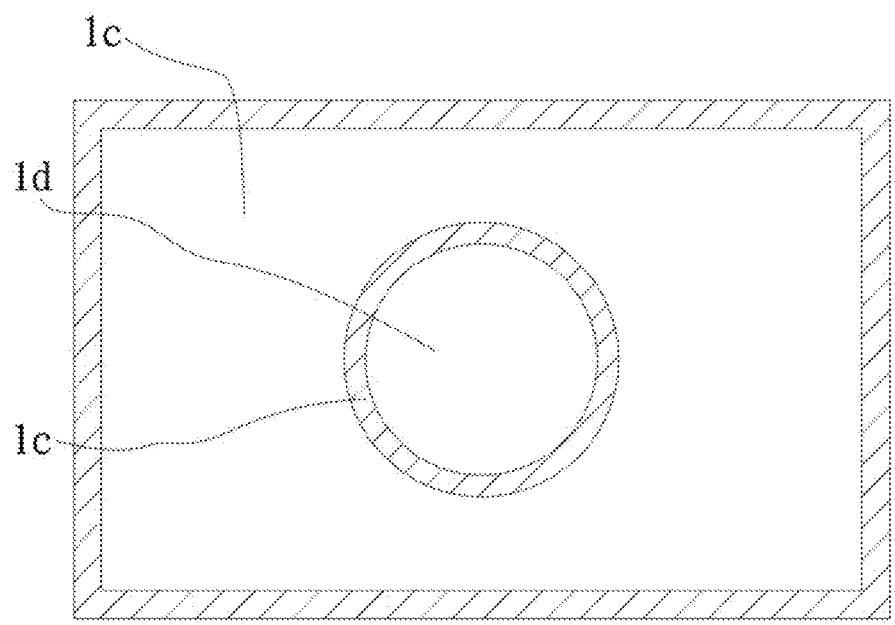
FIG. 4d is a sectional view of the fourth embodiment of the vapor chamber structure of the present invention.

Please now refer to FIGS. 3a and 3b. FIG. 3a is a perspective exploded view of a third embodiment of the vapor chamber structure of the present invention. FIG. 3b is a perspective assembled view of the third embodiment of the vapor chamber structure of the present invention. The third embodiment is partially identical to the first embodiment in structure and thus will not be redundantly described hereinafter. The third embodiment is different from the first embodiment in that the partitioning body 1d is surroundingly disposed on the upper plate 1a to form two receiving spaces 1c on the upper plate 1a. After the upper and lower plates 1a, 1b are correspondingly mated with each other, the independent chambers 11 include a first chamber 11a and a second chamber 11b. The first chamber 11a is positioned at the center of the main body 1, while the second chamber 11b surrounds the first chamber 11a.

In the above embodiments, the partitioning body 1d can transversely or longitudinally extend. Alternatively, the partitioning body 1d can radially extend or annularly extend or extend in any other geometrical form. The partitioning body 1d cooperates with the upper and lower plates 1a, 1b to together define multiple independent chambers 11 in the main body 1 of the vapor chamber, which can be freely varied as shown in FIGS. 4a, 4b, 4c and 4d.

The present invention provides a vapor chamber structure to improve the shortcoming of the conventional vapor chamber. The vapor chamber structure of the present invention has multiple internal independent chambers, in which different physical properties and chemical properties of working fluids in adaptation to different temperature features of different heat sources are contained. Therefore, in the condition that one single heat pipe or vapor chamber is positioned in an environment where the heat pipe or vapor chamber needs to conduct the heat of multiple kinds of heat sources at different temperatures, the vapor chamber structure of the present invention is applicable to the multiple heat sources to conduct the heat at the same time. Moreover, the vapor chamber structure of the present invention includes different kinds of capillary structures or the same capillary structure or a combination of different kinds of capillary structures to improve the shortcoming of the conventional vapor chamber.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A vapor chamber comprising:
   an upper plate;
   a lower plate connected to the upper plate and together defining a first internal chamber and an adjoining second internal chamber, each internal chamber in simultaneous contact with a respective heat source, each respective heat source at a different temperature;
   a first working fluid contained within the first internal chamber and having first physical and chemical properties; and
   a second working fluid contained within the second internal chamber and having second physical and chemical properties, wherein at least one physical or chemical property differs between the first and second working fluids,
   wherein the first internal chamber contacts a first heat source/sink having first properties and the second internal chamber contacts a second heat source/sink having second properties and wherein the first and second working fluids are selected so as to be at phase change conditions under contact with the first and second heat sink/sources, respectively.

2. The vapor chamber of claim 1, further comprising a first and a second capillary structures each disposed, respectively, in the first and the second internal chambers.

3. The vapor chamber of claim 1, further comprising a partition separating and forming a common portion of each of the first and the second internal chambers.

4. The vapor chamber of claim 3, wherein the partition is formed as part of at least one of the upper and the lower plates.

5. The vapor chamber of claim 3, wherein the first and the second internal chambers are planar structures and are arranged on opposite sides of the partition.

6. The vapor chamber of claim 5, wherein the first and the second internal chambers are coplanar.

7. The vapor chamber of claim 3, wherein the partition describes a single linear segment.

8. The vapor chamber of claim 3, wherein the partition describes a two-dimensional path and wherein the first and the second internal chambers are planar structures arranged on opposite sides of the partition.

9. The vapor chamber of claim 8, wherein the first internal chamber encloses the second internal chamber.

10. The vapor chamber of claim 3, comprising multiple partitions and at least a third internal chamber and wherein each partition separates and forms a common portion of a respective pair of adjacent internal chambers.

11. The vapor chamber of claim 10, wherein the multiple partitions extend in transverse or longitudinal directions and wherein at least one pair of internal chambers are arranged on opposite sides of a given partition along the transverse or the longitudinal direction.

12. The vapor chamber of claim 11, wherein the vapor chamber defines four corners and wherein partition segments are connected to each corner.

13. The vapor chamber of claim 11, wherein the vapor chamber defines four sides and wherein partition segments are connected to a midpoint of each side.

14. The vapor chamber of claim 11, wherein the vapor chamber defines four corners and four sides and wherein partition segments are commonly connected to each other at a central position of the vapor chamber.

15. The vapor chamber of claim 3, wherein the partition defines a closed-loop and wherein the first internal chamber fully encloses the second internal chamber.

\* \* \* \* \*